United States Patent [19]

Gotou et al.

[11] Patent Number: 4,558,225
[45] Date of Patent: Dec. 10, 1985

[54] TARGET BODY POSITION MEASURING METHOD FOR CHARGED PARTICLE BEAM FINE PATTERN EXPOSURE SYSTEM

[75] Inventors: Mineo Gotou, Kawasaki; Ryoichi Yoshikawa, Yokohama; Toru Tojo, Yamato; Hirotsugu Wada, Machida, all of Japan

[73] Assignee: Tokyo Shibaura Denki Kabushiki Kaisha, Kawasaki, Japan

[21] Appl. No.: 527,486

[22] Filed: Aug. 29, 1983

[30] Foreign Application Priority Data

Sep. 9, 1982 [JP] Japan ................................ 57-157005

[51] Int. Cl.⁴ .......................... G01B 15/00; G03F 9/00
[52] U.S. Cl. ............................... 250/491.1; 250/442.1
[58] Field of Search ............... 250/491.1, 492.2, 492.3, 250/442.1; 219/121 EY, 121 EX

[56] References Cited

U.S. PATENT DOCUMENTS

| | | | |
|---|---|---|---|
| 3,513,285 | 5/1970 | Imura . | |
| 4,322,626 | 3/1982 | Kawashima | 250/492.2 |
| 4,365,163 | 12/1982 | Davis et al. | 250/491.1 |
| 4,413,186 | 11/1983 | Uema | 250/491.1 |
| 4,433,243 | 2/1984 | Nakamura et al. | 250/491.1 |

FOREIGN PATENT DOCUMENTS

| | | |
|---|---|---|
| 2900921 | 1/1979 | Fed. Rep. of Germany . |
| 3130422 | 7/1981 | Fed. Rep. of Germany . |
| 54-85679 | 7/1979 | Japan . |
| 2054903 | 2/1981 | United Kingdom . |

OTHER PUBLICATIONS

JEE Journal of Electronic Engineering, vol. 18, No. 177, Sep. 1981, Tokyo, Y. Fukatsu et al., pp. 92–95, "Auto Alignment Method," and FIG. 5.
Proceeding of SPIE, vol. 334, Mar. 31–Apr. 1, 1982, p. 139, Herbert E. Mayer, Ernst W. Loebach.

Primary Examiner—Bruce C. Anderson
Assistant Examiner—Paul A. Guss
Attorney, Agent, or Firm—Oblon, Fisher, Spivak, McClelland & Maier

[57] ABSTRACT

Disclosed is a method for measuring the position of a silicon wafer as a workpiece to be exposed. The method is suitably used in an electron beam exposure system. A wafer has a plurality of chip alignment marks which respectively designate a plurality of chip field areas, included in a dicing line area. When the wafer is contained ion a holder and is fixed in the exposure system, edge portions of the wafer are partially scanned with the electron beam to roughly measure the position of the wafer. In accordance with this wafer position data, a wafer surface portion required for detecting only the marks is defined within the dicing line area. In the mark detection with the electron beam, the electron beam irradiates only the defined wafer surface portion of the wafer surface, thereby providing highly precise measurement of the wafer position and avoiding undesirable irritation of the circuit formation area.

10 Claims, 5 Drawing Figures

F I G. 2
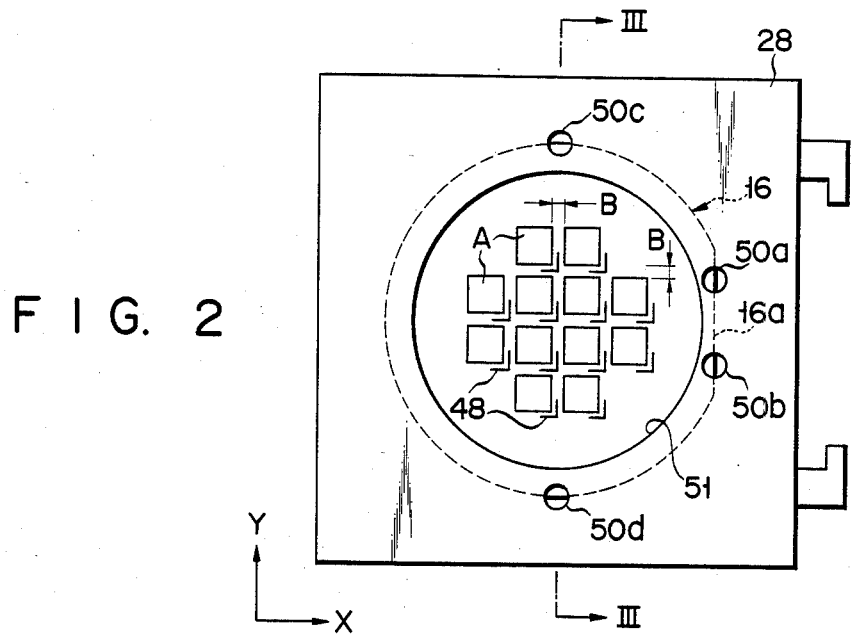
F I G. 3
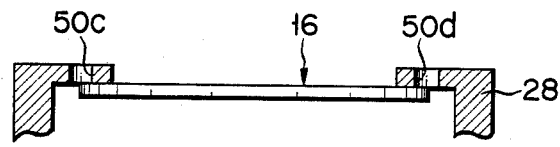
F I G. 4A
F I G. 4B
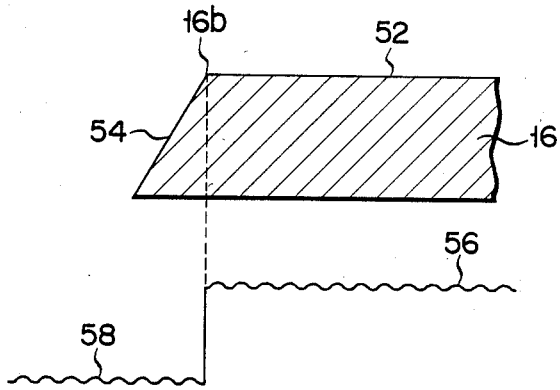

TARGET BODY POSITION MEASURING METHOD FOR CHARGED PARTICLE BEAM FINE PATTERN EXPOSURE SYSTEM

BACKGROUND OF THE INVENTION

The present invention relates generally to a charged particle beam exposure system and, more particularly, to a target body position measuring method for detecting a target body position by electron beam scan to allow for fine alignment between an electronic optical system and a target body such as a semiconductor wafer in an electron beam exposure system for forming an ultrafine pattern in the order of submicrons on the target body by electron beams.

Along with the development of techniques for very large scale integrated circuits (VLSIs), a high-speed, high-resolution electron beam exposure system for forming an ultrafine pattern on a target body such as a monocrystalline silicon wafer in the order of submicrons has been steadily increasing in importance.

In order to align an electronic optical system and a wafer or target body placed on a workpiece table in a conventional electron beam exposure apparatus, an alignment or chip alignment mark on the wafer is scanned with an electron beam, and the wafer position is measured in accordance with mark detection data. When a positional error between the optical system of the electron beam exposure system and the wafer is detected, both the wafer position and electron beam position are corrected in accordance with the wafer position data, thereby performing fine alignment. However, in the conventional alignment method, when the electron beam irradiates the wafer and scans its surface to detect the alignment mark, the electron beam tends to irradiate a circuit formation area or chip area (also referred to as a chip field area) damaging the circuit pattern in the chip area. When the wafer is mechanically loaded onto the workpiece table by a chuck or holder, mechanical alignment precision is relatively low. Therefore, the size of such a mark must be increased in order to readily detect the mark with the electron beam within a short period of time. As a result, an enlarged mark itself comes close to the field area on the wafer. When the electron beam irradiates a wafer which is aligned roughly with respect to the electron beam scan in order to detect the enlarged mark, the electron beam tends to undesirably irradiate the circuit formation area, thereby damaging the circuit.

In order to solve the above drawback, the size of an alignment mark can be decreased to a width of a non-circuit area such as the small area within a dicing line area, so that the electron beam irradiates only the dicing line area. In order to effectively achieve the above technique, however, mechanical precision of wafer alignment with respect to the workpiece table must be vastly improved (e.g., the alignment error must fall within the range of ±20 μm). Otherwise, the mark cannot be rapidly and effectively searched by electron beam irradiation of the wafer in a small area. However, it is very difficult for known mechanical alignment mechanisms to achieve extremely high precision wafer alignment. Even if such high precision can be achieved, the precision mechanism becomes complex, resulting in high cost.

SUMMARY OF THE INVENTION

It is, therefore, an object of the present invention to provide a target body position measuring method which can be suitably applied to a charged particle beam exposure system so as to prevent defects in a chip circuit pattern on a wafer caused by charged particle beam irradiation for position detection of a workpiece such as the wafer as a target body, and to measure a wafer position with high precision in order to perform fine alignment between the wafer as the target body and an optical system of the charged particle beam exposure system.

According to the principles of the present invention, a rough measurement of a workpiece position is made as a preliminary, primary measurement by detecting an edge of a workpiece, and then an alignment mark is scanned as a secondary measurement with a charged particle beam such as an electron beam.

When a semiconductor wafer is used as a workpiece to be exposed, such a wafer generally has an orientation flat. The edge of the wafer is scanned with the electron beam in relation to the orientation flat, thereby producing a rough measurement. In this case, the difference between intensities of electron beam signals of a flat and an inclined or tilted wafer surface can be utilized. Alternatively, a current of a beam passing through the edge can be utilized. The intensity or currents of the beams are measured at several points on the edge to detect the rotational position and the position on the X-axis of the wafer. At least one point on an arcuated edge other than the edge of the orientation flat is detected so as to measure the Y-axis position of the wafer. Wafer alignment on the wafer stage was confirmed to be within a precision range of ±20 μm. A mark position can be detected in accordance with the rough position of the wafer detected in the manner described above. More particularly, the alignment mark is scanned with an electron beam at a distance of 40 μm, and a reflected electron beam signal is obtained. From this reflected signal, a mark signal is obtained to detect the alignment mark position. The mark signal is converted by an A/D converter and is analyzed by a computer, or the like, so that the position of the mark can be detected with high precision. Therefore, even if the mark is formed between the dicing lines, it can be easily scanned with the electron beam and can be readily detected.

The present invention is based on the above assumption and provides a method for measuring a workpiece position through scanning with a charged particle beam a mark formed on a workpiece subjected to charged particle beam exposure on a workpiece table, comprising the steps of: scanning an edge of the workpiece with the charged particle beam to determine a rough position of the workpiece; and scanning the mark formed on the workpiece in accordance with rough position data to detect the position of the mark.

BRIEF DESCRIPTION OF THE DRAWINGS

The present invention is best understood by reference to the accompanying drawings, in which:

FIG. 2 is a plan view showing a wafer holder member included in the electron beam exposure system in FIG. 1 for loading a monocrystalline silicon wafer as a target body therein, thereby aligning and holding the wafer on an X-Y stage;

FIG. 3 is a sectional view of the holder in FIG. 2 taken along the line III—III;

FIGS. 4A and 4B are, respectively, a sectional view of the wafer and a diagram showing a waveform of a highly sensitive electron beam irradiating the wafer and reflected by a wafer edge portion.

DETAILED DESCRIPTION OF THE PREFERRED EMBODIMENT

Figure 1:
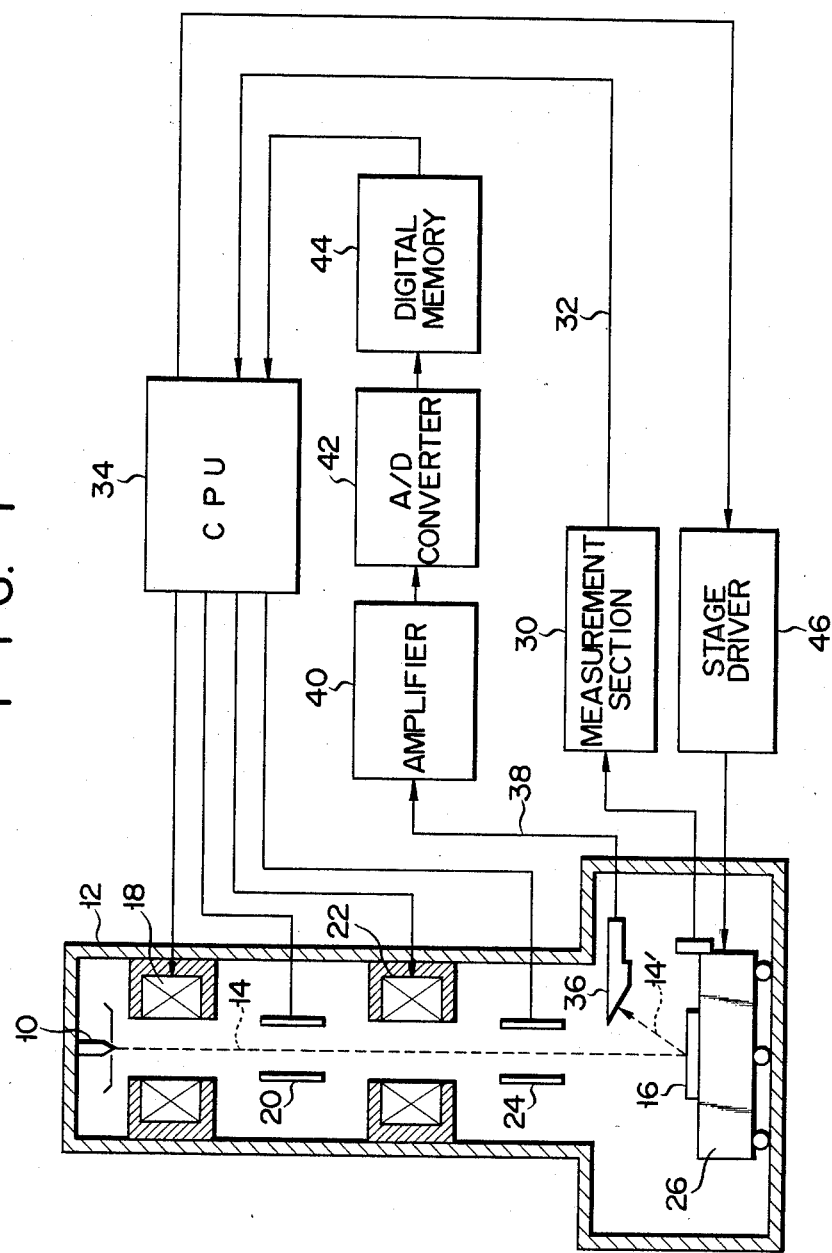
FIG. 1 is a block diagram schematically showing the overall configuration of an electron beam exposure system to which the method of the present invention is preferably applied.

FIG. 1 schematically illustrates an electron beam exposure system to which a method of an embodiment of the present invention is applied. An electron gun 10 is fixed at the top of and inside a vacuum housing 12 to be evacuated by a vacuum pump (not shown). An electron beam 14 emitted from the electron gun 10 and propagating downward in the housing 12 irradiates a workpiece such as a monocrystalline silicon wafer 16 as a target body through a first electromagnetic lens 18, blanking deflection plates 20, a second electromagnetic lens 22 and scanning deflection plates 24, which are controlled by a control processing unit (34) described hereinafter. The wafer 16 is loaded in a wafer holding member such as a cassette or holder 28 (FIGS. 2 and 3), and is positioned on a table or X-Y stage 26 movable in the housing 12 within a plane perpendicular to the radiation direction of the electron beam. The present position of and displacement of the X-Y stage 26 are optically measured with high precision by a laser detector 30. An output measurement signal from the laser detector 30 is supplied to a central processing unit (CPU) 34.

On the other hand, an electron beam 14' reflected by the wafer 16 is incident to an electron detection element 36 which contains, for example, a solid-state sensor. The electron detection element 36 detects the reflected electron beam 14' and supplies a detection signal 38 through a signal amplifier 40 to an analog-to-digital (A/D) converter 42. The A/D converter 42 converts to a digital signal an analog signal generated by the electron detection element 36 and amplified by the amplifier 40. A digital memory 44 is connected to the output terminal of the A/D converter 42 to receive and store therein the digital detection signal. Storage data in the memory 44 is transferred to the CPU 34. The CPU 34 controls the scanning deflection plates 24, as will be described in detail hereinafter, to properly radiate the electron beam 14 from the electron gun 10 onto the wafer 16 in accordance with the input data. The CPU 34 also controls a stage driver 46 to move the X-Y stage 26.

The monocrystalline silicon wafer 16 having a thin-disk shape and stored in the holder 28 fixed on the X-Y stage 26 has a straight end portion 16a called an orientation flat and indicated by a dotted line in FIG. 2. Rectangular chip areas A occur on one major surface of the wafer 16. Identical VLSI chip patterns will be respectively formed on the chip areas A. Chip alignment marks 48 are formed within a wafer area B (grating-like patterned area comprising a dicing line area) excluding the chip areas A. The chip alignment marks 48 indicate the chip areas A, respectively. Each of the chip alignment marks 48 formed in the wafer 16 has a V-shaped section and is formed substantially in a L-shape at an intersection of two dicing line areas B. The holder 28 for loading such a silicon wafer 16 has a main opening 51 which is smaller than the wafer to be located thereabove, and a plurality of, for example, four, openings 50a, 50b, 50c and 50d corresponding to the periphery or edge of the wafer 16. The openings 50a and 50b are formed corresponding to the orientation flat 16a of the wafer 16 when the wafer 16 is mounted in the holder 28, as shown in FIG. 2. The openings 50c and 50d are formed to correspond to arcuated edge portions of the wafer 16, such that a line connecting the openings 50c and 50d is parallel to a line connecting the openings 50a and 50b. FIG. 3 is a representation showing a section of the holder 28 from along the line connecting the openings 50c and 50d. As is apparent from FIG. 3, the arcuated edge portions of the wafer 16 are exposed through the openings 50c and 50d. When the wafer 16 in the holder 28 is observed from the top, two portions of the straight edge of the orientation flat 16a and two portions of the arcuated edge can be observed along the Y-axis through the openings 50, as indicated by the solid lines and solid curves in FIG. 2, respectively. When the electron beam 14 irradiates and scans the edge portions through the openings 50, the rough position of the wafer 16 can be measured in relation to the edge position data at four points on the wafer.

A method for measuring a wafer position in the electron beam exposure system having the configuration described above according to one embodiment of the present invention will be described below.

The silicon wafer 16, the workpiece, is fixed by the holder 28 at a predetermined position of the X-Y stage 26. In this case, the X-Y stage 26 is adjusted by the stage driver 46 to a predetermined position with respect to a track of the electron beam 14. The electromagnetic lenses 18 and 22 and the deflection plates 20 and 22 are controlled by the CPU 34, so that the electron beam 14 emitted from the electron gun 10 irradiates the edge portions of the wafer 16. The electron beam 14 irradiates and scans the four edge portions through the openings or windows 50a, 50b, 50c and 50d formed in the holder 28 in FIG. 2. The electron beam 14 scans the straight edge portions of the orientation flat 16a of the wafer 16 through the holder openings 50a and 50b in the direction of X (i.e., a direction substantially perpendicular to the orientation flat 16a) between these openings. The electron beam 14 scans the arcuated edge portions of the wafer 16 through the openings 50c and 50d in the direction of y between these openings. The energy level and the waveform of the electron beam reflected by the wafer edge portion abruptly change as shown in FIGS. 4A and 4B. When the electron beam 14 irradiates a pattern formation surface (crystal face) 52 and an inclined side surface 54 which are each bounded by a wafer edge 16b of the wafer shown in FIG. 4A, the respective reflected electron beams 14' from these two surfaces have different energy levels 56 and 58. A change in level from the level 58 to the level 56 involves an abrupt vertical increase, as shown in FIG. 4B. Accordingly, the position of the wafer edge can be detected by determining the energy level and the waveform of the reflected electron beam. The edge position of the wafer 16 can be measured in accordance with reflected beam data obtained by partially scanning the main edge portions of the wafer 16 with the electron beam 14 in the manner described above. Even if the wafer 16 of predetermined shape is only roughly positioned on the X-Y stage (e.g., a positional error is increased to several millimeters), positional data indicating the horizontal and vertical positions and the angular position of the wafer in the X-Y coordinate system can be obtained. The positional data is supplied to the CPU 34 through the amplifier 40, the A/D converter 42, and the digital memory 44. The CPU 34 processes the positional data and detects the actual position of the wafer 16 on the X-Y stage 26. This actual position detection of the wafer corresponds to a first stage or primary measurement step of the wafer position measurement method of the present invention.

The edge position of the wafer 16 of predetermined shape relative to the positions of the chip alignment marks 48 on the wafer 16 is determined. In relation to the wafer position data, the CPU 34 operates to define a small area (corresponding to the dicing line area B) of the wafer 16 so as to scan the chip alignment marks 48 formed in the dicing line areas B of the wafer 16 with the electron beam 14. In other words, the surface area of the wafer 16 that is required for scanning the chip alignment marks 48 in the dicing line areas B with the electron beam 14 is effectively limited through the rough wafer position data obtained in the primary measurement step so as to prevent the scanning area from overlapping the circuit area or chip field areas A of the wafer 16. The electron beam 14 again irradiates the wafer 16 so that the beam spot does not exceed the limited electron beam radiation area (i.e., dicing line area B having a width of 80 $\mu$m) to detect the marks 48. Any chip alignment marks 48 included in the narrow dicing line area B can be detected with high precision (i.e., an error of about 0.01 $\mu$m). When several marks 48 are detected, the position of the wafer 16 is precisely measured. The position of the X-Y stage 26 or a deflection voltage applied across the deflection plates 24 can be corrected in accordance with the wafer position measured, thereby achieving highly precise alignment between the optical system and the wafer 16.

Figure 5:
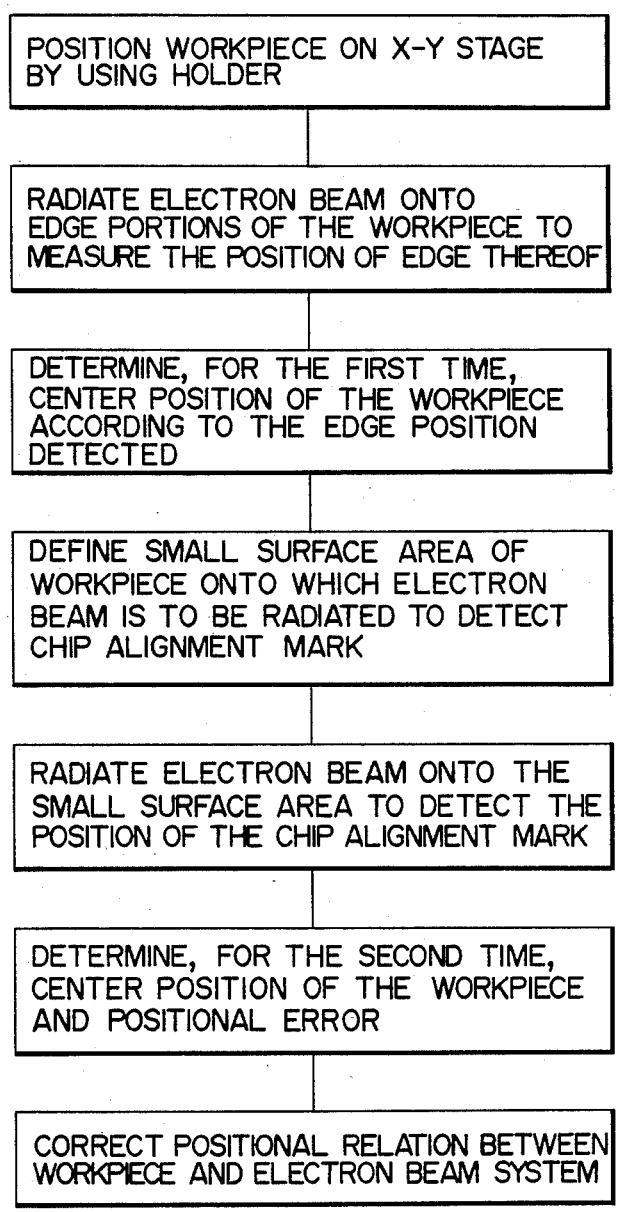
FIG. 5 is a flow chart schematically showing the steps in measuring a workpiece position in the electron beam exposure system.

The detailed operation of wafer position computation by the CPU 34 according to the wafer position measurement method of the present invention will now be described with reference to FIG. 5.

The silicon wafer 16 positioned on the X-Y stage 26 by use of the holder 28 is subjected to wafer rotational angle adjustment by a known wafer pre-aligner within a range of $5 \times 10^{-4}$ rad. The electron beam then irradiates the wafer edge portions through the openings 50a, 50b, 50c and 50d, respectively, formed in the holder 28. If the position measurement values at the wafer edge portions corresponding to the openings 50a, 50b, 50c and 50d are given as $x_a$, $x_b$, $y_c$ and $y_d$, respectively, the primary central position $(X_w, Y_w)$ of the wafer in the rough position measurement can be given as follows:

$$Xw = (x_a + x_b)/2 + xL$$

$$Yw = (y_c + y_d)/2$$

where, $x_L$: distance of the orientation flat 16a from the center of the wafer.

The edge position of the wafer 16 with a predetermined shape relative to the positions of the chip alignment marks 48 formed thereon is determined as previously described. Therefore, when the central position (Xw, Yw) is determined, the electron beam area on the wafer 16 for detecting the chip alignment marks 48 can be defined in relation to the central position (Xw, Yw). If the X components of distances l1 and l2 between the central position of the wafer and one mark and between the central position and another mark are given as $x_{M1}$ and $x_{M2}$, and the Y components thereof are given as $y_{M1}$ and $y_{M2}$, then coordinates M1 and M2 corresponding to the components of the two marks are defined as $(Xw + x_{M1}, Yw + y_{M1})$ and $(Xw + x_{M2}, Yw + y_{M2})$, respectively. In this case, a square area having as its center one of the positions M1 and M2 as described above and a predetermined size (e.g., side of 80 $\mu$m) is computed. This square area is the small surface area to be used for scanning the marks with the electron beam. When the mark positions actually measured by scanning with the electron beam are given as $M1' = (x_{M1}', y_{M1}')$ and $M2' = (x_{M2}', Y_{M2}')$, an angular position represented by $\theta$ and a secondary (corrected) central position (Xw', Yw') are represented as follows:

$$\theta = \tan^{-1}|(x_{M1}' - x_{M2}')/(y_{M1}' - y_{M2}')|$$

$$Xw' = (x_{M1}' + x_{M2}')/2 - x_{M1}\cos\theta$$

$$Yw' = \{(y_{M1}' - y_{M1}\cos\theta + x_{M1}\sin\theta) + (y_{M2}' + y_{M1}\cos\theta - x_{M1}\cos\theta)\}/2$$

If the calculated position indicating the position of the alignment mark within the dicing line area B formed in relation to each chip area A is given as $(x_{ci}, y_{ci})$, and the mark position actually measured is given as $(x_{mi}, y_{mi})$, differences between the x components and between the y component are as follows:

$$\Delta x_i = x_{ci} - x_{mi}$$

$$\Delta y_i = y_{ci} - y_{mi}$$

The angular position of the wafer 16 or the deflection voltage across the deflection plates 24 is corrected to the point that the above differences are zero, thereby performing highly precise alignment between the optical system and the wafer 16.

According to the wafer position measurement method, initially, the edge portions are scanned with the electron beam and the rough position of the wafer 16 on the X-Y stage 26 is determined. The small surface area (limited to the dicing line area B) for detecting the chip alignment marks preformed on the wafer 16 is determined in accordance with the first measurement. Next, the electron beam 14 irradiates the dicing line area B excluding the chip field areas A of the wafer 16 so as not to scan the chip field areas A with the electron beam spot. The present inventors found that any of the small chip alignment marks 48 could be accurately detected with high precision (actually, the wafer position can be measured with an error in the range of at least $\pm 20$ $\mu$m). In addition to this advantage, the electron beam can properly irradiate the small surface area excluding the circuit area such as the chip field area. Furthermore, in order to obtain the above effects, no extra components need be used (although the openings 50 must be formed in the holder 28). Thus, the hardware configuration of the electron exposure system is not complicated. According to the present invention, the wafer, as the workpiece to be exposed, need not be precisely aligned within the mechanical wafer alignment mechanism. Therefore, the mechanical wafer alignment mechanism can be simplified. This leads to simple system hardware. In addition to these advantages, the electron beam irradiates the wafer to detect the wafer edge portions, and a light-emitting element such as an LED and a light-receiving element such as a phototransistor need not be used. Even without these elements, the fine chip alignment marks in the dicing line area on a wafer subjected to ultrafine patterning can be effectively and precisely detected.

Although the present invention has been shown and described with respect to a particular embodiment, various changes and modifications in the invention obvious to a person skilled in the art to which the invention pertains are possible. For example, the number of windows or openings formed in the cassette or holder is not limited to four, but may be modified as needed. The holder may have any structure provided the edge portions can be scanned with the electron beam. The shape and number of marks formed in the wafer may also be changed as needed. Since rough position detection can be performed by edge detection, the present invention can be applied to a mask.

What is claimed is:

1. A method for measuring the actual position of a semiconductor wafer having a straight edge portion when the water is aligned with a charged particle optical system of a pattern forming apparatus for forming desired fine circuit patterns on the wafer by using a charged particle beam such as an electron beam, said method comprising the steps of:

scanning an edge portion of the wafer at plural points including said straight edge portion by said charged particle beam, and obtaining primary wafer position data when the wafer having chip alignment marks is positioned in the pattern forming apparatus, the chip alignment marks being included in a non-circuit area defined between a plurality of chip field areas and corresponding to the plurality of chip field areas, and the fine circuit patterns being formed on the plurality of chip field areas, respectively;

defining a surface portion of the semiconductor wafer to be illuminated with the charged particle beam, said wafer surface portion corresponding to the non-circuit area and including the chip alignment marks of the wafer in accordance with the primary wafer position data;

radiating the charged particle beam onto the wafer such that the charged particle beam exclusively irradiates an area corresponding to the wafer surface portion defined;

scanning the wafer surface portion with the charged particle beam to detect chip alignment marks; and obtaining secondary wafer position data which is more precise than the primary wafer position data in accordance with detected mark data, whereby the actual position of the wafer relative to the electronic optical system is finally measured.

2. The method according to claim 1, wherein said wafer is scanned by the charged particle beams at plural points of the straight edge portion and at plural points of an arcuated edge portion, in said step of obtaining the primary position data.

3. The method according to claim 2, wherein said primary position data obtaining step comprises the step of partially radiating the electron beam onto the straight edge portion of the wafer through a plurality of openings formed in a flat plate portion of a wafer holding member which overlaps with a periphery of the wafer, the wafer holding member being provided to hold the wafer having a substantially disk liked shape and the straight edge portion and being positioned on a workpiece table, thereby scanning the straight edge portion with the electron beam.

4. The method according to claim 3, wherein said primary position data obtaining step comprises the step of radiating the electron beam onto at least one position of the arcuated edge portion through at least one opening formed in the flat plate portion of the wafer holding member, thereby scanning the arcuated edge portion with the electron beam.

5. The method according to claim 2, wherein said beam illumination surface portion defining step comprises the step of computing the wafer surface portion defined which includes the chip alignment marks included in the dicing line area, which is formed on the wafer to define the plurality of chip field areas and to serve as the non-circuit area, so as to respectively designate the plurality of chip field areas, said target body surface portion being prevented from deviating from the dicing line area.

6. The method according to claim 4, wherein said beam illumination surface portion defining step comprises the step of computing the wafer surface portion defined which includes the chip alignment marks included in the dicing line area, which is formed on the wafer to define the plurality of chip field areas and to serve as the non-circuit area, so as to respectively designate the plurality of chip field areas, said wafer surface portion being prevented from being deviated from the dicing line area.

7. The method according to claim 5, wherein the primary semiconductor wafer position data includes edge position data of the wafer which is obtained in accordance with reflected electron beams reflected by the straight edge portion of the wafer and the arcuated edge portion thereof.

8. The method according to claim 7, wherein the wafer surface portion defined is computed solely on the basis of a determined positional relationship between the edge position data and the chip alignment marks in accordance with a predetermined algorithm, using the edge position data as input data.

9. The method according to claim 6, wherein the primary semiconductor wafer position data includes edge position data of the wafer which is obtained in accordance with reflected electron beams reflected by the straight edge portion of the wafer and the arcuated edge portion thereof.

10. The method according to claim 9, wherein the semiconductor wafer surface portion defined is computed solely on the basis of a determined positional relationship between the edge position data and the chip alignment marks in accordance with a predetermined algorithm, using the edge position data as input data.

* * * * *